(12) United States Patent
Nguyen

(10) Patent No.: US 6,172,566 B1
(45) Date of Patent: Jan. 9, 2001

(54) LOW NOISE AMPLIFIER

(75) Inventor: Thai M. Nguyen, Milpitas, CA (US)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/251,698

(22) Filed: Feb. 17, 1999

(51) Int. Cl.[7] .................................................. H03F 3/45
(52) U.S. Cl. ................................................ 330/254; 327/359
(58) Field of Search .............................. 330/254; 327/359

(56) References Cited

U.S. PATENT DOCUMENTS

| | | | |
|---|---|---|---|
| 4,227,256 | 10/1980 | O'Keefee | 455/251 |
| 4,727,335 | * 2/1988 | Yokoyama | 330/254 |
| 5,157,350 | * 10/1992 | Rubens | 330/254 |
| 5,202,553 | 4/1993 | Geller | 250/214 A |
| 5,227,737 | * 7/1993 | Sutliff et al. | 330/254 |
| 5,329,189 | * 7/1994 | Ushida et al. | 330/254 |
| 5,365,279 | * 11/1994 | Harford | 330/254 |
| 5,528,197 | * 6/1996 | Frey | 330/254 |
| 5,530,404 | 6/1996 | Debroux | 330/278 |
| 5,541,553 | 7/1996 | Chujo et al. | 330/51 |
| 5,541,554 | 7/1996 | Stengel et al. | 330/51 |
| 5,548,246 | 8/1996 | Yamamoto et al. | 330/51 |
| 5,598,129 | * 1/1997 | Chambers | 330/254 |
| 5,726,600 | * 3/1998 | Raghavan et al. | 330/254 |
| 5,867,778 | * 12/1999 | Khoury et al. | 327/359 |
| 5,907,261 | * 5/1999 | Jones | 330/254 |

\* cited by examiner

Primary Examiner—Robert Pascal
Assistant Examiner—Khanh Van Nguyen
(74) Attorney, Agent, or Firm—Ronald L. Yin, Esq.; Limbach & Limbach LLP

(57) ABSTRACT

A low noise amplifier circuit is operable in two gain modes: high gain (approximately 15 dB) and low gain or attenuation (approximately −5 dB), with a number of gain paths. In the low gain or attenuation path, the frequency response is improved by adding a diode-connected transistor and a capacitor connected in series and operating as a filter, which effectively puts a pole ($p = -1/R_L C_t$) in the peak of the high frequency response.

8 Claims, 5 Drawing Sheets

New Low Noise Amplifier
(New Art)

Low Noise Amplifier (Prior Art)

New Low Noise Amplifier (New Art)

LOW NOISE AMPLIFIER

BACKGROUND OF THE INVENTION

1. Field of the Invention

The present invention relates to a low noise amplifier (LNA) operable in two gain modes: high gain (approximately 15 dB) and low gain (or attenuation mode) (approximately −5 dB). The LNA can operate in the high gain mode when a gain switch signal is set to one logic level and to operate in the low gain or attenuation mode when the gain switch signal is set to another level.

2. Description of the Related Art

High-frequency circuits find wide application in communications and broadcasting and in the domain of radio frequency laboratory measurements. High speed switching circuits are useful for fast digital instrumentation used in computers and other digital applications.

High-frequency and high-speed circuits are extensions of ordinary linear and digital circuits in the domain where the effects of interelectrode capacitance, wiring inductance, stored charge, and short wavelength begin to dominate circuit behavior. As a result, such circuits begin to depart from those used at lower frequencies.

Low noise amplifiers are well known in the art. However, until now, such amplifiers operating in the Low gain or attenuation mode (approximately −5 dB), suffer the characteristic of a peak gain at high frequency with this peaking being unacceptable in practical applications.

It is also known to connect a switching circuit to the output of an amplifier circuit to provide the amplifier circuit the additional function of switching on and off the output signal of the amplifier circuit.

Such an amplifier may be constructed by connecting a conventional switching circuit, such as a switching circuit employing a diode bridge, as disclosed in Japanese Patent Laid-open (Kokai) No. 54-148358, to a conventional amplifier circuit.

Other methods of performing selective switching between high gain and low gain (or attenuation) paths are described in the art. For example, one such approach includes the use of cascaded amplification stages, as described in U.S. Pat. No. 5,530,404, one or more of which may be switched out, such as by using a diode switch, to effect different power output levels.

Yet another approach selects between impedance networks which are selectively attached to an amplifier output in order to vary the overall output signal level. An example of this is found in U.S. Pat. No. 5,202,553, which describes a transimpedance amplifier characterized by two separate amplifiers coupled together through a switch, one amplifier operating in the high gain mode and the other operating in the low gain or attenuation mode. Each respective amplifier can be selectively switched depending on a sensed current level to be amplified.

A further example can be found in U.S. Pat. No. 4,227,256, which teaches the use of separate high gain and low gain or attenuation amplifiers combined with a graduated switching circuit to eliminate saturation problems when retaining sensitivity. U.S. Pat. No. 5,541,553 shows an amplifier which performs the function of switching on and off its output signal by employing an inverted Darlington circuit made up of a first transistor and a second transistor, with a switching circuit connected across the base and the emitter of the second transistor, through which a comparatively small current flows, and a switching circuit connected between the emitter of the first transistor and the collector of the second transistor.

These amplifiers typically "tweaked" the peak gain by having a switch in both the high gain and low gain or attenuation paths. Furthermore, the "tweaking" is performed in the subsequent stage or the output of the low noise amplifier, mainly in the automatic gain control section.

FIG. 1 is a schematic circuit diagram of a prior art low noise amplifier 10. The circuit 10 of FIG. 1 has two separate gain paths A and B, both coupled to an input source 12 and a transistor switch 14, used to select either gain path A or B. current through gain path A flows through transistor 18, which is M times larger in size than transistor 24, through which current of gain path B flows. M is typically between 10 and 20.

In such an amplifier, called a common emitter type amplifier, the resulting voltage gain has the relationship:

$$A_v = -g_m(r_o \| R_c)$$

where $g_m = qI_c/kT$ and where ro is the combined impedance of transistor 28 and transistor 22, $R_c$ is resistor 16, q is electron charge (or $1.6 \times 10^{-19}$ coulomb), $I_c$ is the current flow through either transistor 18 or transistor 24. (More current flows through transistor 18 because transistors 18 and 24 are biased with the same potential, and the size of transistor 18 is M times larger than the size of transistor 24.), k is boltzmann's constant, and T is temperature in Kelvin degrees.

In operation, when the transistor switch 14 receives a logic low level, the amplifier 10 is set to operate in the high gain mode (in which current flows through path A, and also through path B). Conversely, when the transistor switch 14 receives a logic high level, the amplifier 10 is set to operate in the low gain or attenuation mode (in which current flows only through path B).

Tracing the current path A, resistor 16 acts as a gain booster, characterized by the relationship between high gain and a large collector resistance.

The current flowing through current path B flows from the output 20 through transistor 22 and through transistor 24. When operating in the high gain mode, the current flow through current path B can almost be ignored, because the transistor 18 is M times bigger in size than transistor 24 and the base of both transistors 18 and 24 are biased with the same potential. Thus, the current flows in current path A through transistor 18 is M times larger than the current flow in current path B through transistor 24.

When gain switch 14 receives a logic level high, the high gain path A can be ignored because the current flow through transistor 18 is detoured through transistor 14 instead of going through transistor 28 and no voltage amplification takes place at the junction of resistor 16 and transistor 28. Thus, the circuit 10 consists essentially of the low gain or attenuation path B.

In both cases, the circuit 10 has characteristics of a common-emitter type amplifier. Tracing low gain or attenuation path B, resistor 16 acts as a gain booster, characterized by the relationship between high gain and a large collector resistance, with more current through transistor 18 than through transistor 24.

FIG. 2 shows the gain vs. frequency when the circuit 10 of FIG. 1 is operating in the low gain or attenuation mode. As can be seen from FIG. 1, at point P the high frequency peak passes unwanted high frequencies. This peak is unacceptable in practical applications.

SUMMARY OF THE INVENTION

A low noise amplifier circuit has a signal input, a signal output, a gain control input and a plurality of gain paths. Each of the plurality of gain paths is connected in parallel to each of the signal input, signal output and gain control input. The circuit further comprises means for selecting one of the plurality of gain paths to connect the signal input to the signal output. The amplifier circuit also comprises means for amplifying the signal input, with the amplifying means connected between the signal input and the signal output. Finally, the amplifier circuit comprises filtering means for filtering the input signal through at least one of the gain paths.

DETAILED DESCRIPTION OF THE DRAWINGS

Figure 1:
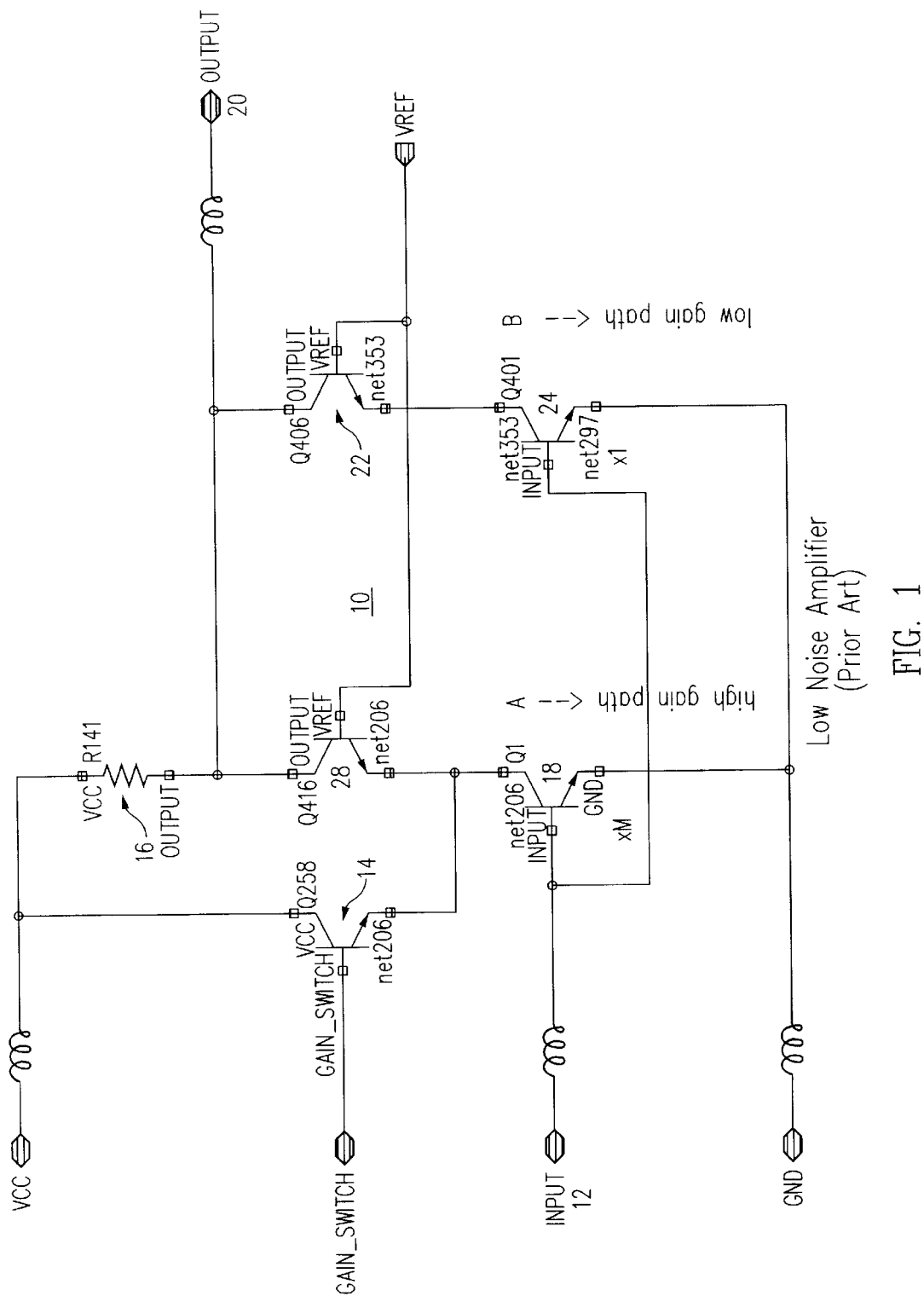
FIG. 1 is a schematic circuit diagram of a prior art low noise amplifier circuit.
Figure 3:
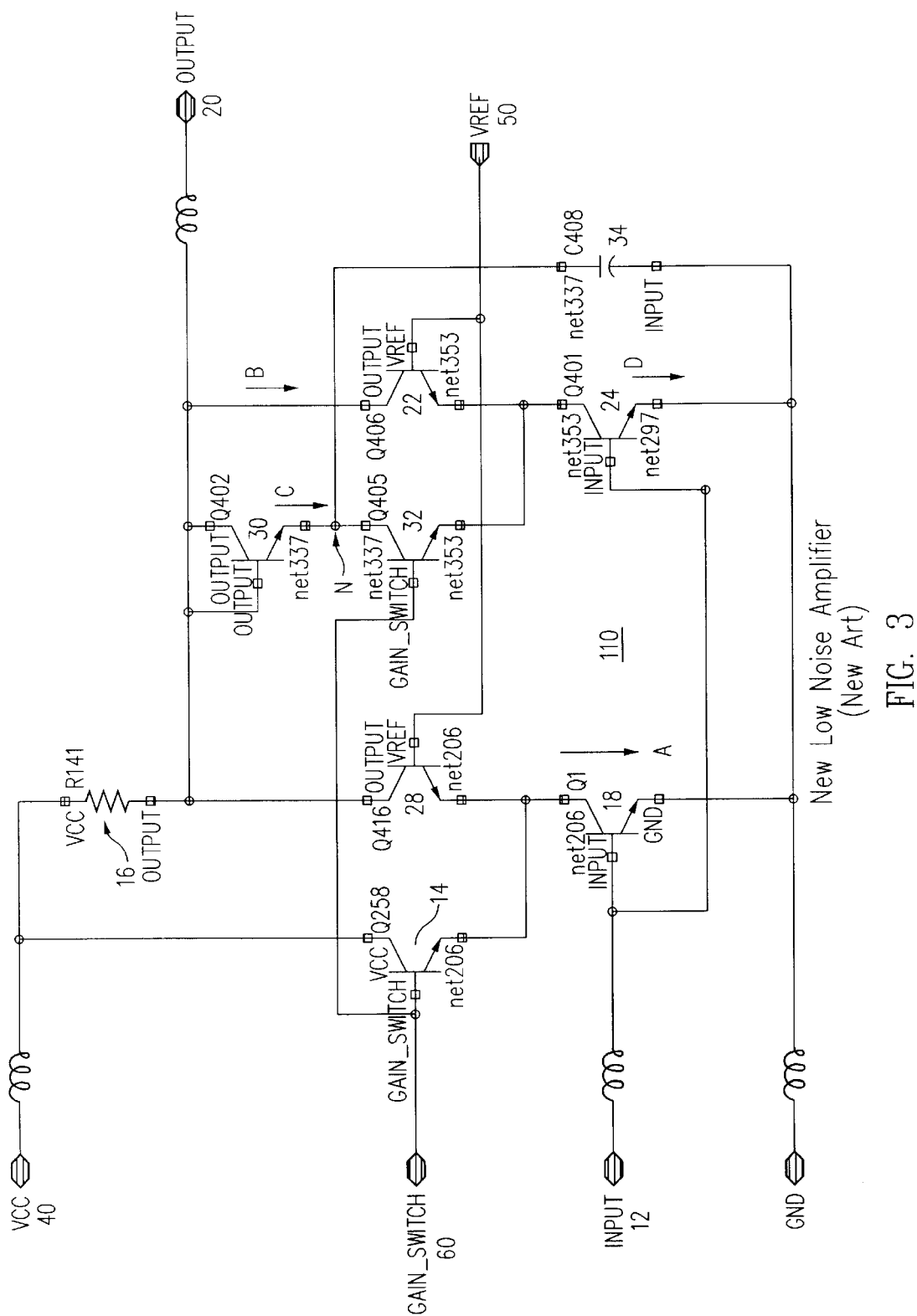
FIG. 3 is a schematic circuit diagram of one embodiment of an improved low noise amplifier circuit of the present invention.

Referring to FIG. 3 there is shown one embodiment of an improved amplifier 110 of the present invention. The improved amplifier 110 has many parts similar to the circuit 10, shown in FIG. 1. Thus, like numerals will be used to describe like parts.

Similar to the amplifier 10, the improved amplifier 110 has a plurality of gain paths A, BD, and CD all of which are coupled to an input source 12 and a transistor switch 14, used to select either gain path A and BD or CD.

In operation, when the transistor switch 14 receives a logic low level, the amplifier 110 is set to operate in the high gain mode (in which current flows through path A, and also through path BD). Conversely, when the transistor switch 14 receives a logic high level, the amplifier 110 is set to operate in the low gain or attenuation mode (in which current flows only through path CD).

Gain path A of the amplifier 110 is represented by a transistor 28 having its collector connected through a resistor 16 to an external voltage source 40. The base of transistor 28 is connected to a biasing voltage source Vref 50. Transistor 18 is connected in cascode relationship with transistor 28. That is, the collector of transistor 18 is connected directly to the emitter of transistor 28 while the emitter of transistor 18 is connected directly to ground. The base of transistor 18 receives an input signal 12. Furthermore, switching transistor 14 is connected in parallel with transistor 28, its collector connected directly to the external voltage source 40 while its emitter is coupled directly to the emitter of transistor 28. The base of transistor 14 receives a gain switching signal 60.

The second gain path BD is represented by a transistor 22 having its collector connected through a resistor 16 to the external voltage source 40. The base of transistor 22 is connected to the biasing voltage source $V_{ref}$ 50. Transistor 24 is connected in cascode relationship with transistor 22. That is, the collector of transistor 24 is connected directly to the emitter of transistor 22 while the emitter of transistor 24 is connected to ground. The base of transistor 24 is connected to receive the input signal 12.

The third gain path CD is represented by a switching transistor 32 which is connected in series with transistor 30 which are together coupled in parallel with transistor 22. Transistor 30 has its base and collector terminals connected together which in turn are connected through resistor 16 to the external voltage source 40. The emitter of transistor 30 is connected directly to the collector of transistor 32. The emitter of transistor 32 is connected to the emitter of transistor 22. The base of transistor 32 is connected to receive the gain switching signal 60. Finally, a capacitor 34 has one terminal connected to ground, the other terminal connected at node N, in series with transistor 30.

In effect, diode connected transistor 30 acts as a diode switch, serving to separate out the high gain path from the low gain or attenuation path, which are then combined at the collector of transistor 24.

Thus, in operation, when gain switch 14 receives a logic level low, the current follows the gain paths A and BD. In high gain mode, resistor 16 boosts the gain, characterized by the relationship between high gain and a large collector resistance. The contribution of the current from the gain path CD, however, can be virtually neglected because transistor 32 is not switched on. In addition, there is little or no current flow along the gain path C through capacitor 34, because the capacitor 34 blocks the flow of current.

When switching transistor 14 receives a logic level high, the high gain path A can be ignored and the current follows the gain path CD. In such case, the capacitor 34 at node N taken in series with diode-connected transistor 30 acts as a filter, which effectively puts a pole $(p=-1/R_L C_t)$ ($R_L$ and $C_T$ are as defined hereinafter) in the peak of the high frequency response.

Figure 5:
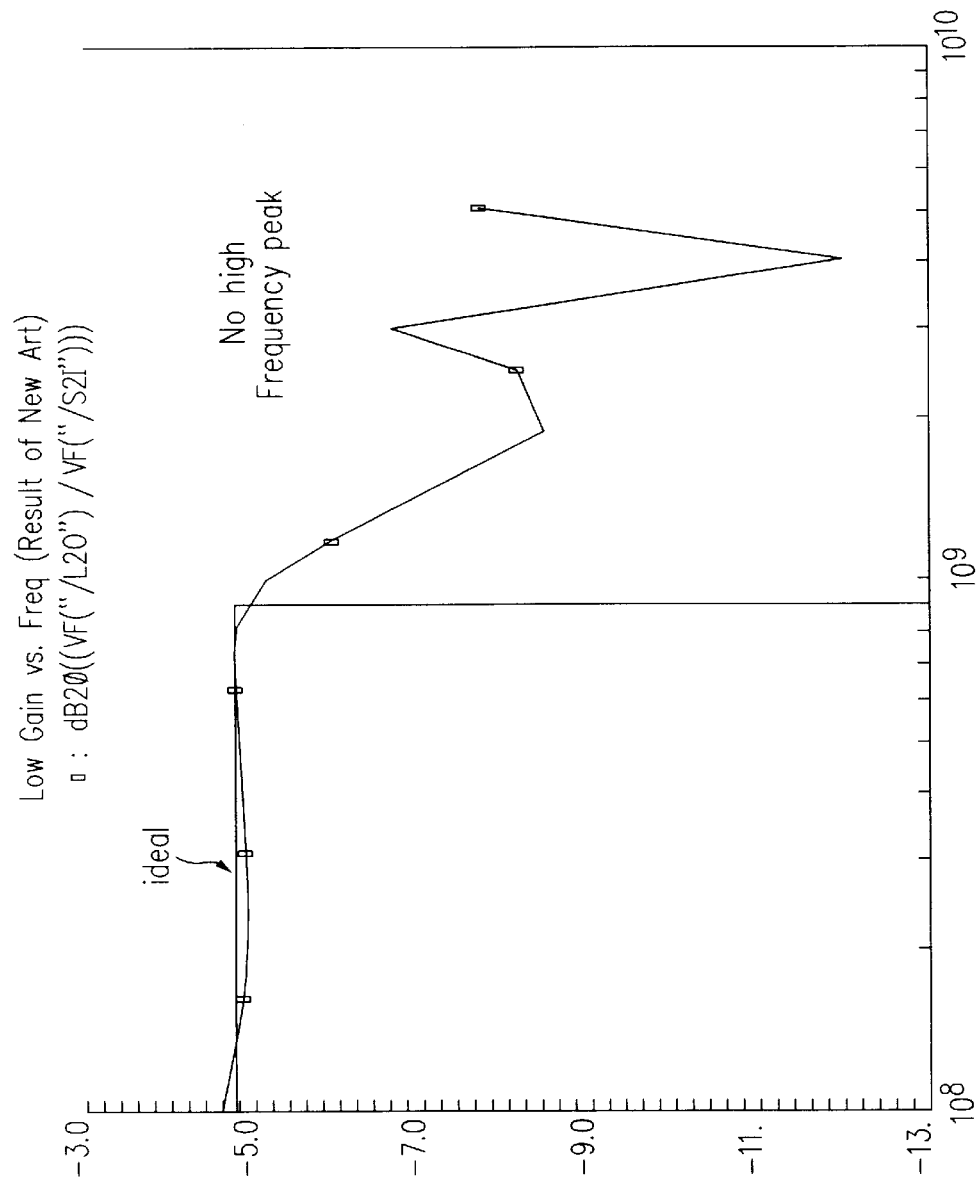
FIG. 5 is a graph showing gain vs. frequency response of the circuit of the present invention (of either embodiment shown in FIG. 3 and 4), when operating in a low gain or attenuation mode.

FIG. 5 shows the resulting gain vs. frequency response for the circuit 110 of FIG. 3, when the circuit 110 is operating in a low gain or attenuation mode. As can be seen in FIG. 5, the amplifier gain is almost constant over a wide frequency range. In this frequency range, all capacitances (coupling, bypass and transistor internal capacitances) have negligible effects and can be ignored in gain calculations. At the high frequency end, the gain drops due to effect of the internal capacitances of the device.

Generally, when performing high frequency analysis, the amplifier 110 can be expressed by a high-frequency hybrid-pi model, which accounts for the slight effect of the collector voltage on the collection current in the active region of operation, the effect of the collector voltage on the base current, and the resistance of the silicon material of the base region between the base terminal and a fictitious internal, or intrinsic, base terminal. This latter terminal represents the base side of the emitter-base junction. Also, the emitter-base capacitance and the collector-base capacitance are taken into consideration. The emitter-base capacitance is composed of two parts: a diffusion capacitance, which is proportional to the dc bias current, and a depletion diffusion capacitance, which depends on the value of $V_{BE}$. The collector-base capacitance is entirely a depletion capacitance and its value depends on $V_{CB}$.

Determination of frequency response of amplifiers is well known in the art. In determining the frequency response of the amplifier 110 of FIG. 3, the overall gain of the amplifier can be written in the form:

$$\frac{V_o}{V_i} = -\frac{g_m R_L}{1 + s C_T R_L}$$

where $C_T = C_o | |C$ where C is capacitor 34, and $C_o$ is the output capacitor of node N. $R_L = R_c | |r_o$, where $R_c$ is resistor 16 and $r_o$ is the combined impedance of transistors 28 and 22.

The roots of the numerator polynomial are the transfer function zeros, or transmission zeros, while the roots of the transfer function denominator are the transfer function poles, or the natural modes of the network.

Figure 2:
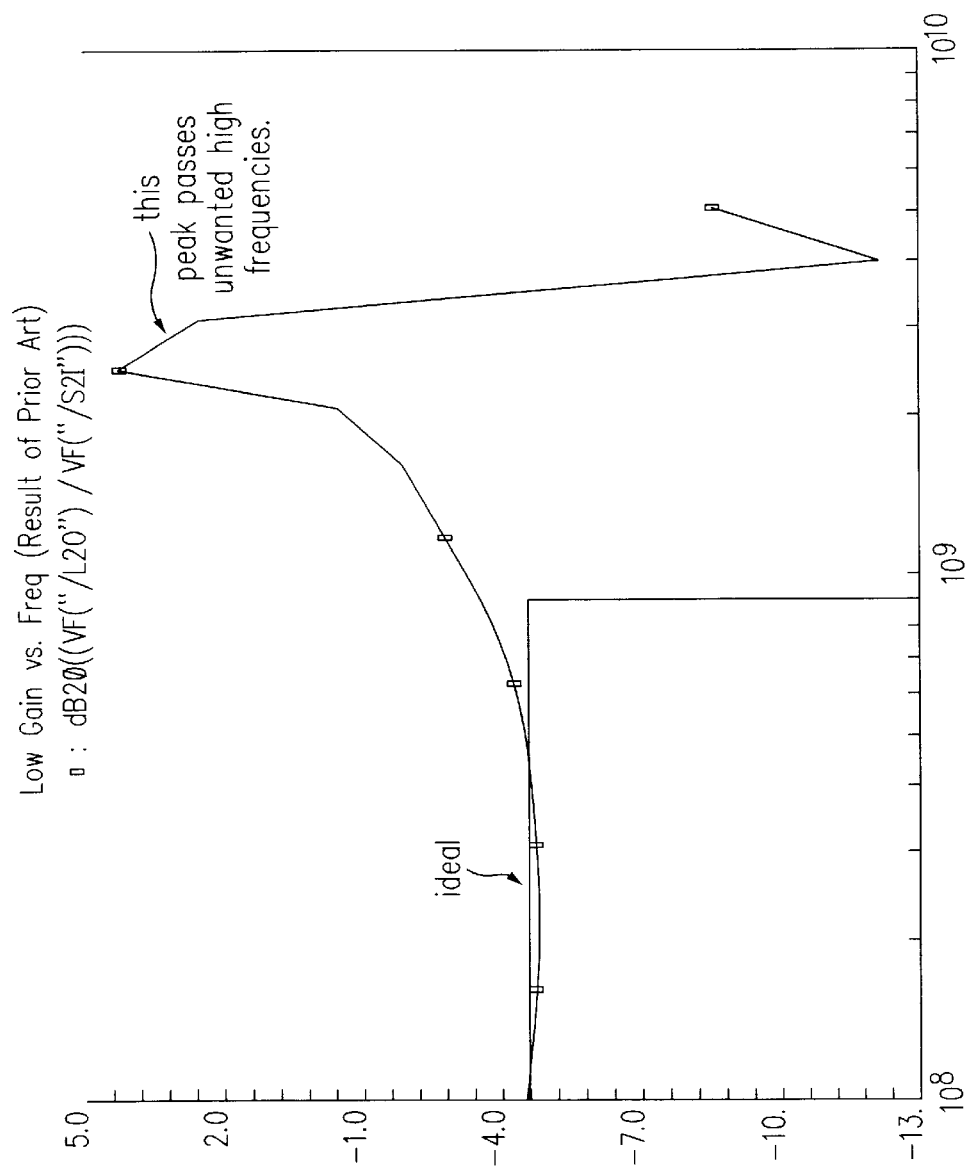
FIG. 2 is a graph showing gain vs. frequency response of the prior art circuit of FIG. 1, when operating in a low gain or attenuation mode.

Therefore, capacitor 34 at node N taken in series with diode-connected transistor 30, in effect, incorporates a pole $p = -1/R_L C_t$ in the transfer function, which effectually drops the peak of the high frequency response. As a result, in FIG. 5, there is a peak in the high frequency range is considerably reduced compared to the graph shown in FIG. 2, and is no longer capable of passing unwanted high frequencies.

Figure 4:
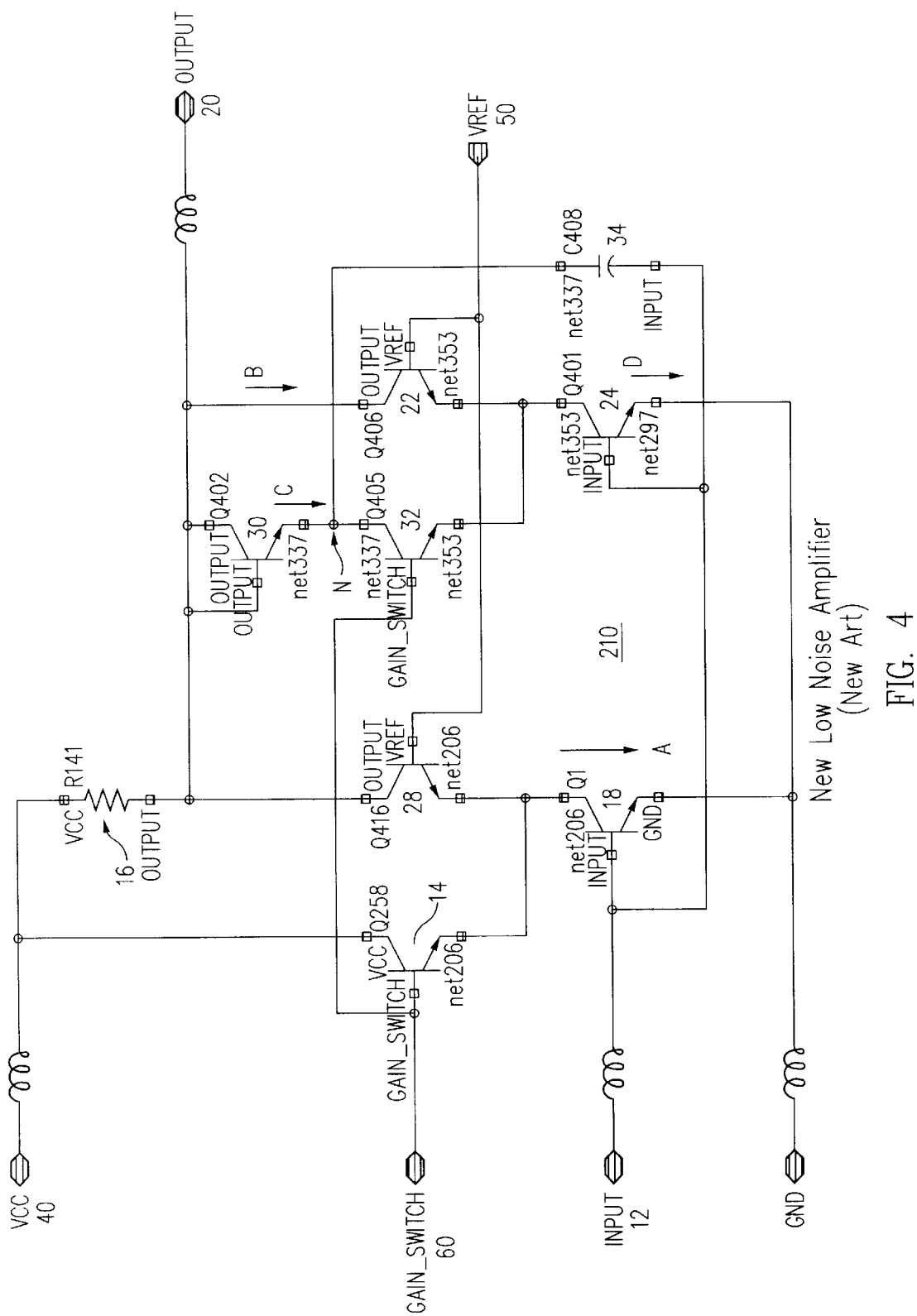
FIG. 4 is a schematic circuit diagram of another embodiment of an improved low noise amplifier circuit of the present invention.

Referring to FIG. 4 there is shown a second embodiment of an improved amplifier 210 of the present invention. The improved amplifier 210 is similar to the improved amplifier 110 shown in FIG. 3 Therefore, like numerals will be used to describe like parts. The improved amplifier 210 is identical to the improved amplifier 110 except that the capacitor 34 has one terminal connected to node N and another terminal connected to the base of transistor 24. The performance of the improved amplifier 210 is substantially identical to the performance of the improved amplifier 110.

What is claimed is:

1. A low noise amplifier circuit, comprising:
   a signal input;
   a signal output;
   a gain switching input;
   a plurality of gain paths, connected in parallel, each of said gain paths being connected to each of said signal input, said signal output and said gain switching input;
   means for switching said plurality of gain paths, to connect said signal input to said signal output;
   means for amplifying said signal input, said amplifying means connected between said signal input and said signal output; and
   filtering means for filtering said input signal through at least one of said gain paths.

2. A low noise amplifier circuit, as in claim 1, wherein said plurality of gain paths comprise a first gain path and a second gain path.

3. A low noise amplifier circuit, as in claims 2 wherein said transistor amplifier comprises npn bipolar junction transistors.

4. A low noise amplifier circuit, as in claim 1, wherein said means for switching at least one of said gain paths comprises a diode-connected transistor.

5. A low noise amplifier circuit, as in claim 4, wherein said diode-connected transistor is an npn bipolar junction transistor.

6. A low noise amplifier circuit, as in claim 1, wherein said filter means comprises a diode-connected transistor connected in series with a capacitor.

7. A low noise amplifier circuit, comprising:
   a signal input;
   a signal output;
   a gain control input;
   a first gain path connected to said signal input, said signal output and said gain control input, said first gain path including a cascode connected transistor amplifier;
   a second gain path connected to said signal input, said signal output and said gain control input, said second gain path comprising a cascode connected transistor amplifier;
   said cascode connected transistor amplifier of said first gain path, being larger in size than said cascode connected transistor amplifier of said second gain path;
   said first gain path and said second gain path are connected in parallel to a common node;
   a diode-connected transistor having a first terminal and a second terminal, said first terminal being connected between said common node of each of said first gain path and said second gain path and said second terminal being connected to said signal output; and
   a capacitor having a first terminal and a second terminal, said first terminal of said capacitor being connected to said common node of each of said first gain path and said second gain path and said second terminal of said capacitor being connected to said signal input.

8. In a low noise amplifier circuit, having a signal input, a signal output, a gain control input, a plurality of gain paths each gain path connecting said signal input to said signal output and said gain control input, wherein the improvement comprising:
   a diode-connected transistor having a first terminal and a second terminal, said first terminal being connected between a common node of each of said first gain path and said second gain path and said second terminal being connected to said signal output; and
   a capacitor having a first terminal and a second terminal, said first terminal of said capacitor being connected to said common node of each of said first gain path and said second gain path and said second terminal of said capacitor being connected to said signal input.

* * * * *